United States Patent
Shin et al.

(10) Patent No.: US 8,008,956 B1
(45) Date of Patent: Aug. 30, 2011

(54) FREQUENCY SYNTHESIZER AND HIGH-SPEED AUTOMATIC CALIBRATION DEVICE THEREFOR

(75) Inventors: Hyunchol Shin, Seoul (KR); Jaewook Shin, Seoul (KR)

(73) Assignee: Kwangwoon University Industry-Academic Collaboration Foundation, Seoul (KR)

( * ) Notice: Subject to any disclaimer, the term of this patent is extended or adjusted under 35 U.S.C. 154(b) by 0 days.

(21) Appl. No.: 12/789,940

(22) Filed: May 28, 2010

(30) Foreign Application Priority Data

May 18, 2010 (KR) .................. 10-2010-0046954

(51) Int. Cl.
*H03L 7/06* (2006.01)
(52) U.S. Cl. ...................... 327/157; 327/148
(58) Field of Classification Search .............. 327/148, 327/157
See application file for complete search history.

(56) References Cited

U.S. PATENT DOCUMENTS

| | | | |
|---|---|---|---|
| 6,545,545 B1 * | 4/2003 | Fernandez-Texon | 331/1 R |
| 6,724,265 B2 * | 4/2004 | Humphreys | 331/17 |
| 6,952,124 B2 * | 10/2005 | Pham | 327/156 |

* cited by examiner

*Primary Examiner* — Hai L Nguyen
(74) *Attorney, Agent, or Firm* — Edwards Angell Palmer & Dodge LLP; Kongsik Kim

(57) ABSTRACT

A frequency synthesizer and an automatic calibration device are disclosed. An automatic calibration device for a phase-locked loop based frequency synthesizer includes: a frequency-to-digital converter for converting a frequency of a signal outputted from a voltage controlled oscillator into a first digital value; a frequency difference detector for calculating a difference between the first digital value outputted from the frequency-to-digital converter and a second digital value corresponding to a target frequency; an automatic frequency calibration logic for selecting an optimal control code for a capacitor bank such that an output frequency of the voltage controlled oscillator is closer to the target frequency; and a loop bandwidth calibration logic for tuning a charge pump gain such that a loop bandwidth is kept constant in the optimal control code using the frequency-to-digital converter. Thus, the calibration speed can be increased, and the loop bandwidth can be kept constant within the output frequency range.

16 Claims, 10 Drawing Sheets

FREQUENCY SYNTHESIZER AND HIGH-SPEED AUTOMATIC CALIBRATION DEVICE THEREFOR

CROSS-REFERENCE TO RELATED APPLICATIONS

This application claims the benefit of Korean Patent Application No. 10-2010-0046954, filed with the Korean Intellectual Property Office on May 18, 2010, the disclosure of which is incorporated herein by reference in its entirety.

BACKGROUND

1. Technical Field

The present invention relates to an RF frequency synthesizer for wireless communication and a high-speed automatic calibration device for the frequency synthesizer. More particularly, the invention relates to a wideband fractional-N frequency synthesizer and a high-speed automatic calibration device therefor having improved calibration speed and precision.

2. Description of the Related Art

The RF frequency synthesizer is a device for generating signals at a particular frequency and is essential in wireless transceivers.

In such frequency synthesizers, a phase-locked loop (PLL) system is mainly used to generate a wanted target frequency.

In a frequency synthesizer, a wider range of output frequency is very likely to cause greater changes in VCO gain ($K_{VCO}$) and division ratio N, and therefore phase noise, loop bandwidth (LBW), and lock time is also very likely to vary greatly as the output frequency varies. As such, the wider the bandwidth of a frequency synthesizer, the more difficult it becomes to provide an optimal design. To overcome this problem, it is essential to utilize an automatic calibration circuit, which maintains the loop bandwidth, lock time, and phase noise at a relatively constant level over the wide bands.

FIG. 1 is a schematic illustration of a frequency synthesizer having an automatic frequency calibration circuit according to the related art.

Referring to FIG. 1, a voltage controlled oscillator 100 may include a capacitor bank 102, and an automatic frequency calibration circuit 104 may search for a suitable control code for the capacitor bank 102.

As illustrated in FIG. 1, a frequency synthesizer can include a frequency divider 106, a phase-frequency detector and charge pump 108, and a low-pass loop filter 110.

In a frequency synthesizer such as that shown in FIG. 1, the time spent by the automatic frequency calibration circuit 104 (frequency calibration time) in searching for a control code for the capacitor bank 102 may be a major cause of prolonging the overall lock time of the frequency synthesizer.

As the additional delay for searching the control code may increase power consumption and lower data transmission speed in wireless transceivers, it is an important issue in designing an automatic frequency calibration circuit to reduce the frequency calibration time of the automatic frequency calibration circuit.

Another important issue in designing an automatic frequency calibration circuit is frequency resolution. Frequency resolution is especially important in a fractional-N frequency synthesizer.

FIG. 2 represents frequency tuning curves for a voltage controlled oscillator, where FIG. 2(a) shows typical frequency tuning curves for a fractional-N frequency synthesizer.

As illustrated in FIG. 2(a), there may often be occasions when the frequency spacing between adjacent curves ($f_{spacing}$) becomes smaller than the frequency ($f_{REF}$).

In order for the automatic frequency calibration circuit to operate with an acceptable precision, the frequency resolution ($f_{resolution}$) always has to be kept smaller than the spacing between adjacent curves ($f_{spacing}$), and this means that the frequency resolution of the automatic frequency calibration circuit has to be smaller than the reference frequency.

This problem can occur not only in a fractional-N frequency synthesizer, but also in a typical integer-N wideband frequency synthesizer.

Referring to FIG. 2(b), it can be noted that, in a wideband frequency synthesizer, the changes in the gain of the voltage controlled oscillator ($K_{VCO}(n)$) and in the spacing between adjacent curves ($f_{spacing}(n)$) may increase greatly according to the capacitor bank control code n value.

For example, when using a capacitor bank having a binary weighted structure, the rate of change for $f_{spacing}(n)$ is known to be cubically proportional to the ratio of the maximum to minimum operating frequencies of the voltage controlled oscillator (J. Kim et al., "A Wideband CMOS LC VCO with Linearized Coarse Tuning Characteristics," IEEE Tran. Circuits and Systems-II: Express Brief, vol. 55, no. 5, pp. 399~403, May 2008).

In this case, $f_{spacing}(n)$ can become easily smaller than $f_{REF}$, meaning that the frequency resolution of an automatic frequency calibration circuit has to be designed to be smaller than $f_{REF}$ for a wide band synthesizer design, not only in a fractional-N type but also in an integer-N type frequency synthesizer.

However, for a frequency synthesizer to which a conventional automatic frequency calibration circuit such as that illustrated in FIG. 1 is applied, obtaining a frequency resolution lower than $f_{REF}$ may require a very long calibration time.

A third design issue for an automatic frequency calibration circuit is the calibration method used for the frequency calibration.

An automatic frequency calibration circuit according to the related art may use the method of comparing the frequency ($f_{DIV}$) of a divided signal of a voltage controlled oscillator with a reference frequency ($f_{REF}$).

This relative frequency comparison method is currently the most widely used method. It usually provides a frequency calibration speed in the order of several tens of microseconds. With this method, however, two pulses are counted simultaneously, and the relative comparison of the two signal frequencies is performed using a frequency comparator. Here, since the clock speed of the counter is as low as the reference frequency, a relatively long calibration time is required, ranging from about several tens to several hundreds of microseconds, if a high resolution is needed.

Another method is to perform the frequency comparison after converting the frequencies into voltage quantities using a time-to-voltage converter (TVC).

While this method of using a TVC can be very fast, with the frequency calibration time less than a microsecond, when it is applied to a fractional-N frequency synthesizer, additional time may be required to compensate for errors caused by the delta-sigma modulator (DSM), so that the calibration time is lengthened to a similar level to that of other conventional methods.

A second calibration required in a frequency synthesizer is the calibration of loop bandwidth (LBW). As shown in Equation 1 below, the loop bandwidth of a charge pump PLL is proportional to charge pump gain ($I_{CP}$) and $K_{VCO}$, and is inversely proportional to the phase-locked loop's division ratio N. Here, since $K_{VCO}$ and N may vary according to the output frequency, the loop bandwidth may also vary accordingly.

$$LBW \propto Icp \cdot \frac{Kvco}{N} \quad \text{[Equation 1]}$$

Therefore, in order to keep the loop bandwidth constant, it may be necessary to compensate for the changes in $K_{VCO}$ and N by suitably adjusting the charge pump gain ($I_{CP}$).

In a phase-locked loop based wideband frequency synthesizer, a binary weighted capacitor bank is generally used. Since $K_{VCO}$ is proportional to $$\left(\left[\frac{VCO \text{ maximum frequency}}{VCO \text{ maximum frequency}}\right]\right)^3$$

in such a phase-locked loop, the loop bandwidth is proportional to $$\left(\left[\frac{VCO \text{ maximum frequency}}{VCO \text{ maximum frequency}}\right]\right)^2$$

if the charge pump gain ($I_{CP}$) is kept constant. Therefore, the change in loop bandwidth becomes greater as the operating band becomes wider.

Although many studies have been conducted aimed at keeping the loop bandwidth constant, there have been problems in applying the conventional approaches to the wide band design.

For example, the method of compensating $K_{VCO}$ non-linearity with $I_{CP}$ (C. Lam, et al., "A 2.6-GHz/5.2-GHz Frequency Synthesizer in 0.4-µm CMOS Technology," IEEE Journal of Solid State Circuits, vol. 35, no. 5, pp. 788~794, May 2000) is very sensitive to the process, voltage, temperature variations. The method using an averaging varactor to keep $K_{VCO}$ constant and compensating the change in division ratio N with $I_{CP}$ in an analog split-tuned phase-locked loop structure (T. Wu, et al., "Method for Constant Loop Bandwidth in LC-VCO PLL Frequency Synthesizers," IEEE Journal of Solid State Circuits, vol. 44, no. 2, pp. 427~435, February 2009) results in poorer phase noise performance due to the use of a large varactor in the phase-locked loop structure. The method of compensating loop bandwidth using step response time in the time domain of a phase-locked loop (Y. Akamine et al., "ΔΣ PLL Transmitter with a Loop-Bandwidth Calibration System," IEEE Journal of Solid State Circuits, vol. 43, no. 2, pp. 497~506, February 2008) is sensitive to changes in $K_{VCO}$ and is thus unsuitable for wide band applications.

SUMMARY

In order to resolve the problems discussed above, an aspect of the invention is to propose a frequency synthesizer and an automatic calibration device therefor, which can greatly reduce frequency calibration time while providing a frequency resolution lower than the reference frequency, and which can also keep the loop bandwidth constant in the output frequency bands.

To achieve the above objective, an aspect of the invention provides an automatic calibration device for a phase-locked loop based frequency synthesizer that includes: a frequency-to-digital converter configured to convert a frequency of a signal outputted from a voltage controlled oscillator into a first digital value; a frequency difference detector configured to calculate a difference between the first digital value outputted from the frequency-to-digital converter and a second digital value corresponding to a target frequency; an automatic frequency calibration logic configured to select an optimal control code for a capacitor bank such that an output frequency of the voltage controlled oscillator is closer to the target frequency; and a loop bandwidth calibration logic configured to tune a charge pump gain such that a loop bandwidth is kept constant at the optimal control code using the frequency-to-digital converter.

Preferably, the frequency difference detector can include: a first difference calculator configured to calculate the difference between the first digital value and the second digital value; and a second difference calculator configured to calculate a difference between digital values of frequencies at a minimum and maximum tuning voltages within a linear segment of a frequency tuning curve displaying linear tuning characteristics at the optimal control code.

Preferably, the loop bandwidth calibration logic can include: a voltage controlled oscillator gain calculator configured to calculate a gain of the voltage controlled oscillator using a value outputted from the second difference calculator and the difference between the maximum tuning voltage and minimum tuning voltage; and a charge pump code calculator configured to calculate a code for tuning charge pump gain using the calculated gain of the voltage controlled oscillator, a reference loop bandwidth, and a division ratio for the optimal control code.

More preferably, the charge pump code calculator may calculate the charge pump gain for the optimal control code using the following equation:

$$I_{CP_{target}} = I_{CP} \cdot \frac{K_{VCO}}{N \cdot f_{[?][?]}} \cdot \frac{N \cdot f_{target}}{\frac{\Delta f}{\Delta V_{tune}}}, \quad \text{[Equation]}$$

where $I_{CP\_target}$ is a new charge pump gain at a target frequency, $I_{CP}$ is a charge pump gain at an arbitrary reference output frequency of the frequency synthesizer, $K_{VCO}$ is a gain of the voltage controlled oscillator at the reference output frequency, $N.f$ is a division ratio at the reference output frequency, $N.f_{target}$ is a division ratio at the target output frequency, and $\Delta f/\Delta V_{tune}$ is a gain of the voltage controlled oscillator at the target output frequency with the optimal control code.

According to an embodiment of the invention, the frequency-to-digital converter can include: a frequency divider configured to divide signals outputted from the voltage controlled oscillator by a particular ratio and output each divided signal as a signal having multiple phases; and one or more counter configured to count each of the signals having multiple phases.

An automatic calibration device according to an embodiment of the invention can further include: a timing control logic configured to generate timing signals for starting and ending the automatic frequency calibration process and the loop bandwidth calibration process.

Preferably, the automatic frequency calibration logic can include: a binary searcher configured to perform a binary search according to a relative difference between the first digital value and the second digital value; and an optimal code selector configured to select an optimal control code, which causes the voltage controlled oscillator to output a frequency close to the target frequency, through a difference value calculated by the frequency difference detector and a search result of the binary searcher.

According to an embodiment of the invention, the frequency difference detector may output one of a "fast" or a "slow" flag signal corresponding to a relative difference between the first digital value and the second digital value, and the binary searcher may perform the binary search according to the flag signal.

Preferably, the first digital value can vary according to a control code selected by the optimal code selector before completion of frequency calibration process, and the frequency difference detector can periodically output a difference value between the varying first digital value and the second digital value.

More preferably, the automatic frequency calibration logic can further include: a least difference finder configured to renew a least difference value by comparing a difference value presently outputted by the frequency difference detector with a previously stored least difference value.

The optimal code selector may store a closest control code searched by the binary searcher when the least difference value is renewed.

Another aspect of the invention provides an automatic calibration device for a phase-locked loop based frequency synthesizer that includes: a frequency-to-digital converter configured to convert frequencies of a first signal and a second signal outputted from a voltage controlled oscillator into a first digital value and a second digital value, respectively; a frequency difference detector configured to calculate a difference between the first digital value and the second digital value; and a loop bandwidth calibration logic configured to tune a charge pump gain using a difference between the first digital value and the second digital value such that a loop bandwidth is kept constant within a range of output frequency bands of the voltage controlled oscillator, where the first signal is a signal outputted by the voltage controlled oscillator for a minimum tuning voltage within a segment displaying linear frequency characteristics in an optimal control code for a capacitor bank of the voltage controlled oscillator, and the second signal is a signal outputted by the voltage controlled oscillator for a maximum tuning voltage within the segment.

Yet another aspect of the invention provides an RF frequency synthesizer that includes: a phase-locked loop, which includes a voltage controlled oscillator, a frequency divider, a reference frequency generator, a phase/frequency detector, and a pulse-voltage converter; and an automatic calibration loop, which includes the voltage controlled oscillator and an automatic calibration device, where the automatic calibration device includes: a frequency-to-digital converter configured to convert a frequency of a signal outputted from a voltage controlled oscillator into a first digital value, a frequency difference detector configured to calculate a difference between the first digital value outputted from the frequency-to-digital converter and a second digital value corresponding to a target frequency, an automatic frequency calibration logic configured to select an optimal control code for a capacitor bank such that an output frequency of the voltage controlled oscillator is closer to the target frequency, and a loop bandwidth calibration logic configured to tune a charge pump gain such that a loop bandwidth is kept constant at the optimal control code using the frequency-to-digital converter.

According to certain aspects of the invention, the output frequency of a voltage controlled oscillator may be counted directly and converted into digital values, and these may be compared with the digital value for a target frequency, so that the difference between the output frequencies and the target frequency can be calculated with high precision, and the frequency calibration speed can be improved.

Also, according to certain aspects of the invention, the output frequencies may be converted into digital values, and these may be used to also calculate the gain of the voltage controlled oscillator as a digital value, so that the loop bandwidth can be calibrated quickly and with high precision.

Additional aspects and advantages of the present invention will be set forth in part in the description which follows, and in part will be obvious from the description, or may be learned by practice of the invention.

DETAILED DESCRIPTION

A detailed description will be provided as follows, with reference to the accompanying drawings, on certain preferred embodiments of the invention.

An automatic calibration device according to an aspect of the invention provides calibration such that enables a voltage controlled oscillator to output a frequency close to the target frequency. Although the term "device" will be used in the following descriptions, it will be apparent to those skilled in the art that the invention is not thus limited, and other terms can be used such as "automatic calibration circuit," "automatic calibration component," and the like.

Figure 1:
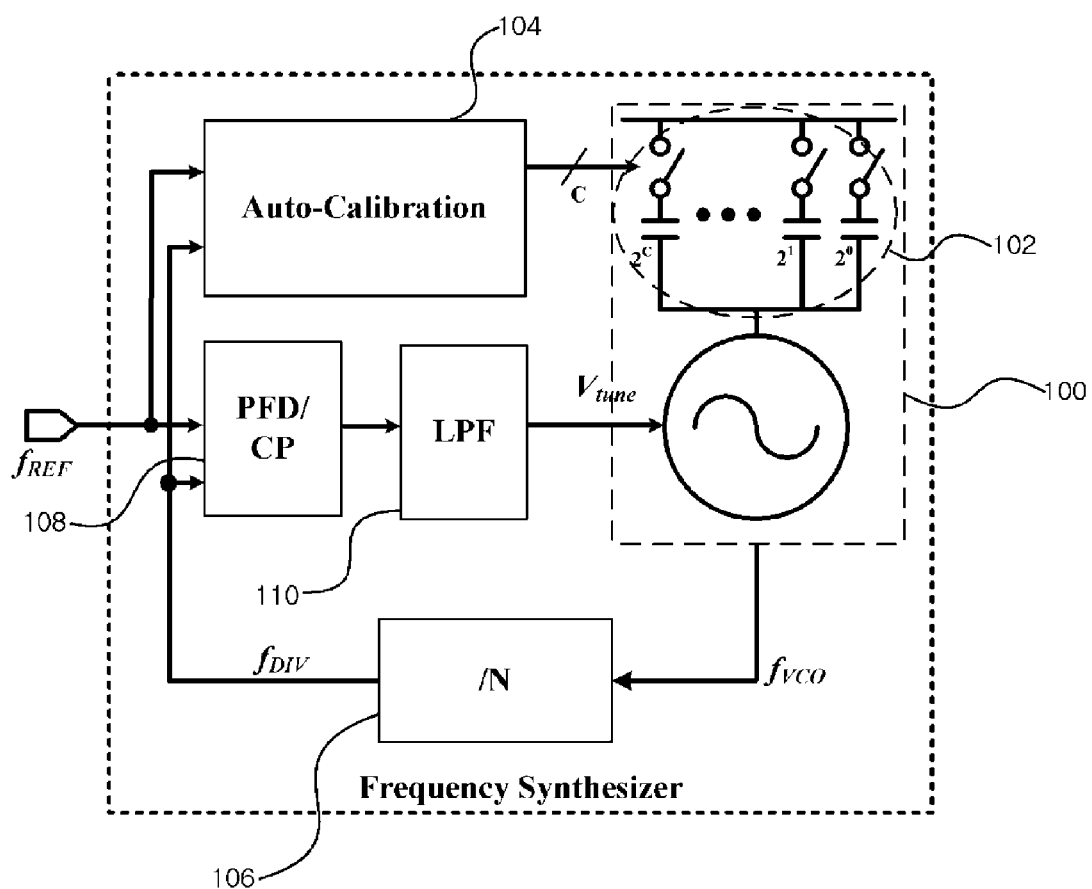
FIG. 1 schematically illustrates a frequency synthesizer having an automatic frequency calibration circuit according to the related art.
Figure 2:
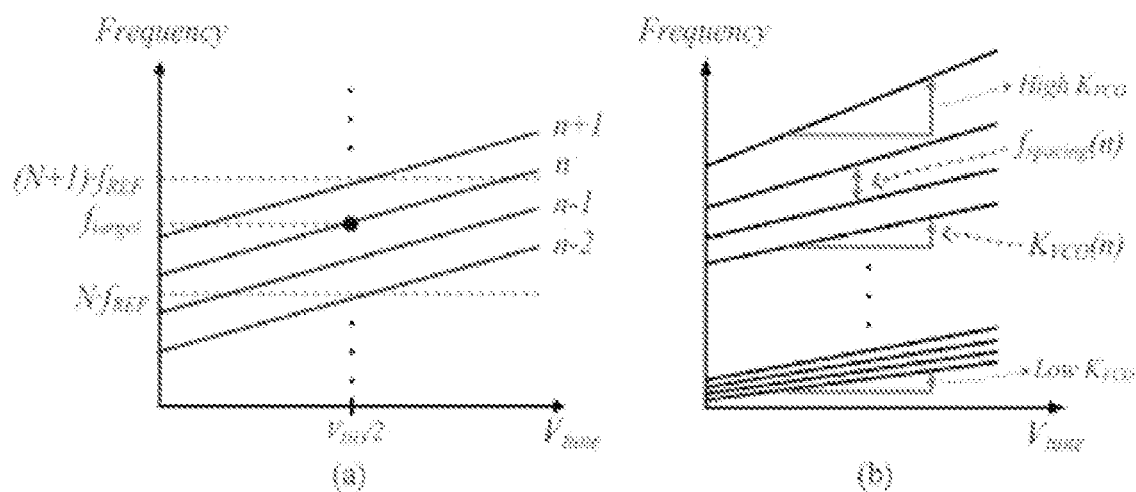
FIG. 2 represents frequency tuning curves for a voltage controlled oscillator.
Figure 3:
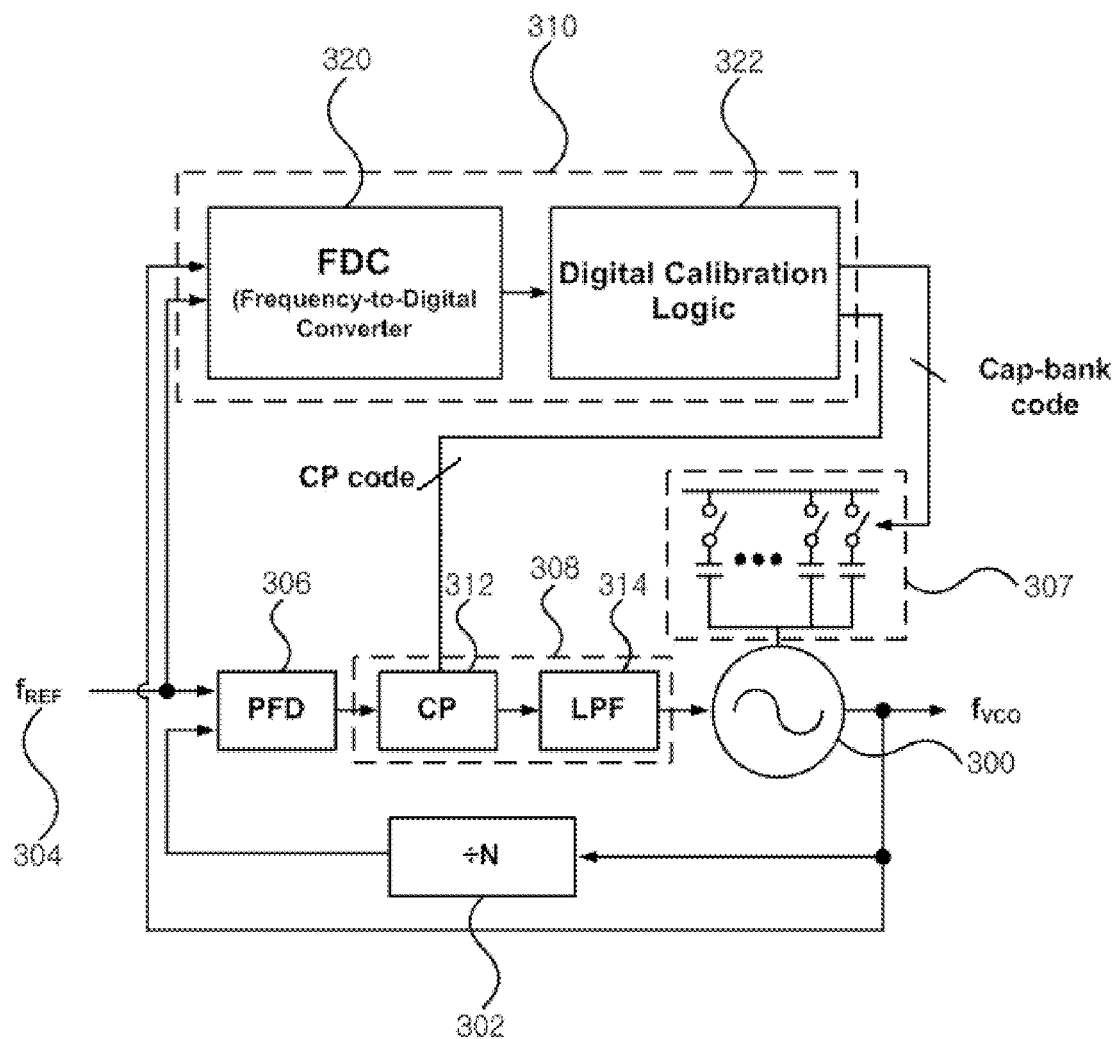
FIG. 3 schematically illustrates a frequency synthesizer to which an automatic calibration device according to a preferred embodiment of the invention is applied.

FIG. 3 schematically illustrates a frequency synthesizer to which an automatic calibration device according to a preferred embodiment of the invention is applied.

As illustrated in FIG. 3, a frequency synthesizer according to an embodiment of the invention can include a phase-locked loop, which may include a voltage controlled oscillator (VCO) 300, a frequency divider 302, a reference frequency generator 304, a phase/frequency detector 306, and a pulse-voltage converter 308, and an automatic calibration loop, which may include the voltage controlled oscillator 300 and the automatic calibration device 310.

Looking first at the phase-locked loop, the voltage controlled oscillator 300 may output a VCO signal of a particular frequency.

For phase locking, the VCO signal may be transferred to the frequency divider 302, at which the frequency divider 302 may output a signal that is divided by a particular ratio from the VCO signal.

Here, the frequency divider 302 may divide the VCO signal by a fractional division ratio. The frequency divider 302 can divide the VCO signal also by an integer division ratio in the case of an integer-N frequency synthesizer. This case is also encompassed by the scope of the invention.

The phase/frequency detector 306 may compare the phase and frequency of the divided signal with those of a signal outputted from the reference frequency generator 304, and may output a pulse corresponding to the differences.

The pulse-voltage converter 308 may include a charge pump 312 and a loop filter 314.

The charge pump 312 may adjust the amount of electric charge according to the pulse signal outputted from the phase/frequency detector 306, and the adjusted amounted of electric charge may be converted into voltage, to be fed through the loop filter 314 and into the voltage controlled oscillator 300.

As the above procedures are repeated, the frequency of the VCO signal may be locked to the target frequency.

A frequency synthesizer according to this embodiment can be a delta-sigma fractional-N frequency synthesizer, in which case the phase-locked loop can additionally include a delta-sigma modulator.

The automatic calibration device of the frequency synthesizer according to this embodiment may perform automatic frequency calibration and loop bandwidth calibration.

In order for the frequency synthesizer to output a target frequency, it may be desirable to first perform an automatic frequency calibration, for calibrating the output frequency to be close to the target frequency, by suitably tuning the capacitor bank of the voltage controlled oscillator 300 in an open-loop configuration before closed-loop operation is initiated.

For the automatic frequency calibration, an automatic calibration device 310 according to this embodiment can include a frequency-to-digital converter 320 and a digital calibration logic 322.

The frequency-to-digital converter 320 may count the VCO signal directly and output the results as a digital value, while the digital calibration logic 322 may compare this directly with the digital value of the target frequency and perform the frequency calibration according to the results.

Here, the frequency calibration can be a process of finding an optimal control code for the capacitor bank.

Also, after the frequency calibration process is completed, the digital calibration logic 322 may control the gain of the charge pump 312 such that the loop bandwidth may be kept constant at the target frequency.

That is, the digital calibration logic 322 may keep the loop bandwidth constant within the overall output frequency range of the voltage controlled oscillator 300, in addition to performing the frequency calibration.

Here, tuning the charge pump gain can be a process of finding an optimal charge pump gain code.

According to an embodiment of the invention, the loop bandwidth calibration can be performed after the completion of the automatic frequency calibration, but the invention is not thus limited.

In the following, however, the description will be provided mainly with regard to that case in which the loop bandwidth calibration is performed after the automatic frequency calibration is completed.

Figure 4:
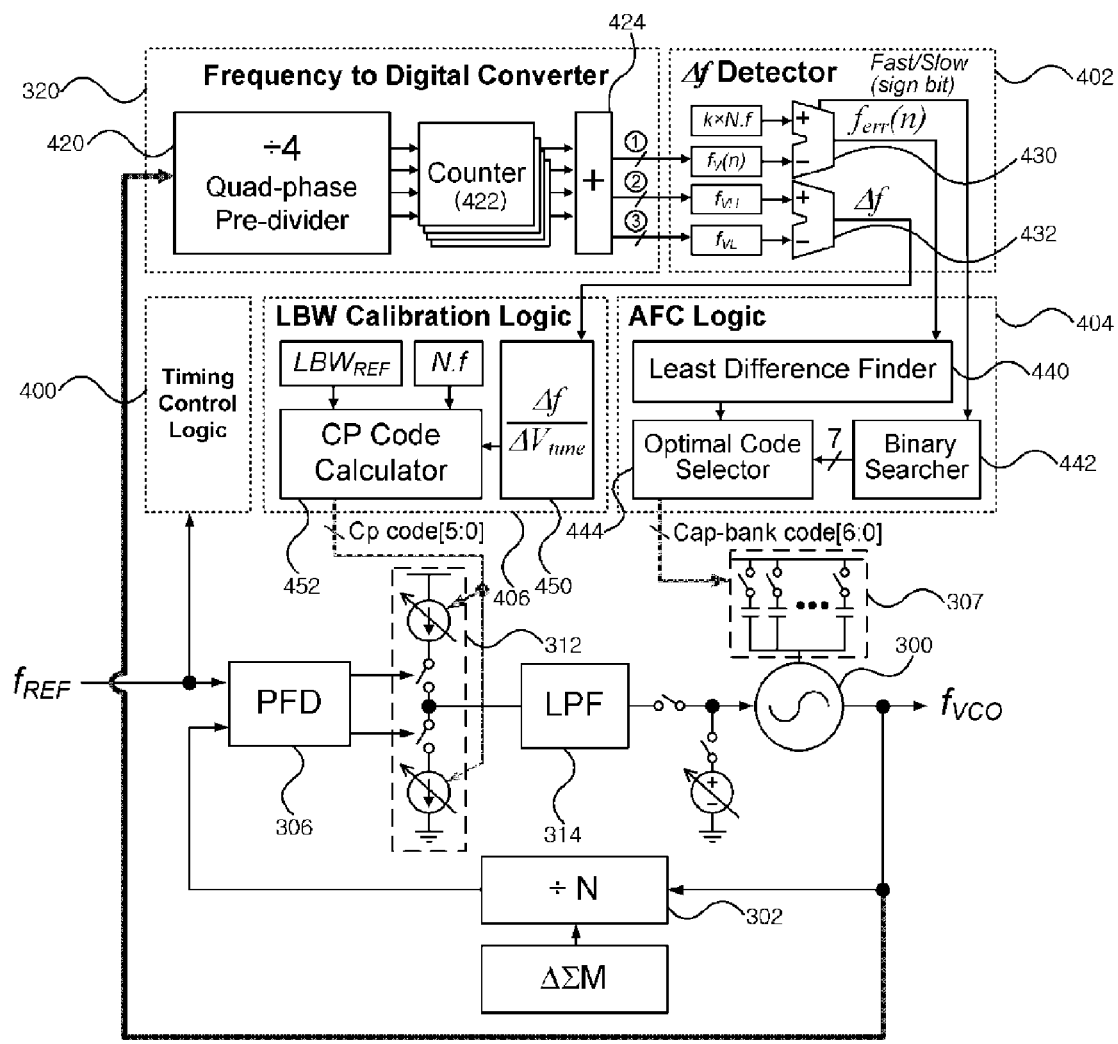
FIG. 4 illustrates the detailed composition of an automatic calibration device according to an embodiment of the invention.

FIG. 4 illustrates the detailed composition of an automatic calibration device according to an embodiment of the invention.

As illustrated in FIG. 4, an automatic calibration device 310 according to this embodiment can include a timing control logic 400, a frequency-to-digital converter (FDC) 320, a frequency difference detector ($\Delta f$ detector) 402, an automatic frequency calibration (AFC) logic 404, and a loop bandwidth calibration (LBC) logic 406.

Here, the elements other than the frequency-to-digital converter 320 can be included in the digital calibration logic 322.

The timing control logic 400 may generate timing signals for starting and ending the calibration processes and may generate other clocks required for the automatic frequency calibration and loop bandwidth calibration processes.

The frequency-to-digital converter 320 may start to operate by a synchronized starting signals of the timing control logic 400.

The frequency-to-digital converter 320 may convert the VCO signal outputted from the voltage controlled oscillator 300 into a digital value and output the digital value.

To be more specific, the frequency-to-digital converter 320 can include a frequency divider 420, a counter 422, and an adder 424.

The frequency divider 420 may divide the VCO signal by a particular ratio.

According to this embodiment, the frequency divider 420 may, while dividing the VCO signal, cause each divided signal to have multiple phases.

In the following, a description will be provided using an example in which a frequency divider 420 according to this embodiment divides the VCO signals by 4 and at the same time outputs the four divided signals with the same phase difference of 90 degree each other.

Figure 5:
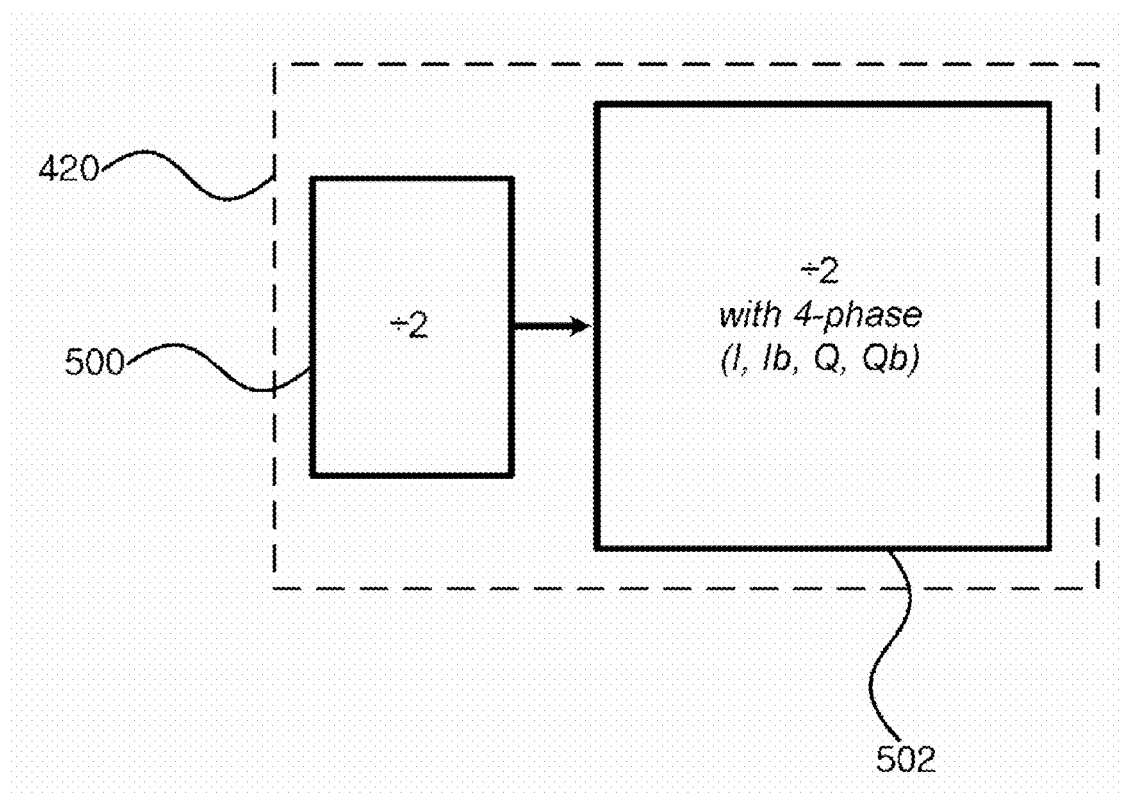
FIG. 5 illustrates the detailed composition of a frequency divider according to an embodiment of the invention.

In this case, the frequency-to-digital converter 320 can include a first frequency divider 500 that divides the VCO signals by two, and a multi-phase generator 502 that divides the -two divided signals by two once again and outputs the signals after converting each signal to have multiple phases, as illustrated in FIG. 5.

In correspondence to the multi-phase signals above, the frequency-to-digital converter 320 can be equipped with four counters 422, with each counter 422 counting the rising edges of each phase signal during an period of time given by the timing control logic 400.

The values counted by the counters 422 may be added by the adder 424 and outputted.

According to this embodiment, the multiple number of multi-phase signals, obtained by dividing the signals outputted by the voltage controlled oscillator 300, may be counted individually, so that the operating speed of the counters 422 may be reduced while not sacrificing the precision of the final output values.

In the following, a description will be provided first for the case in which the automatic frequency calibration operation is performed after performing a frequency count as described above.

Figure 6:
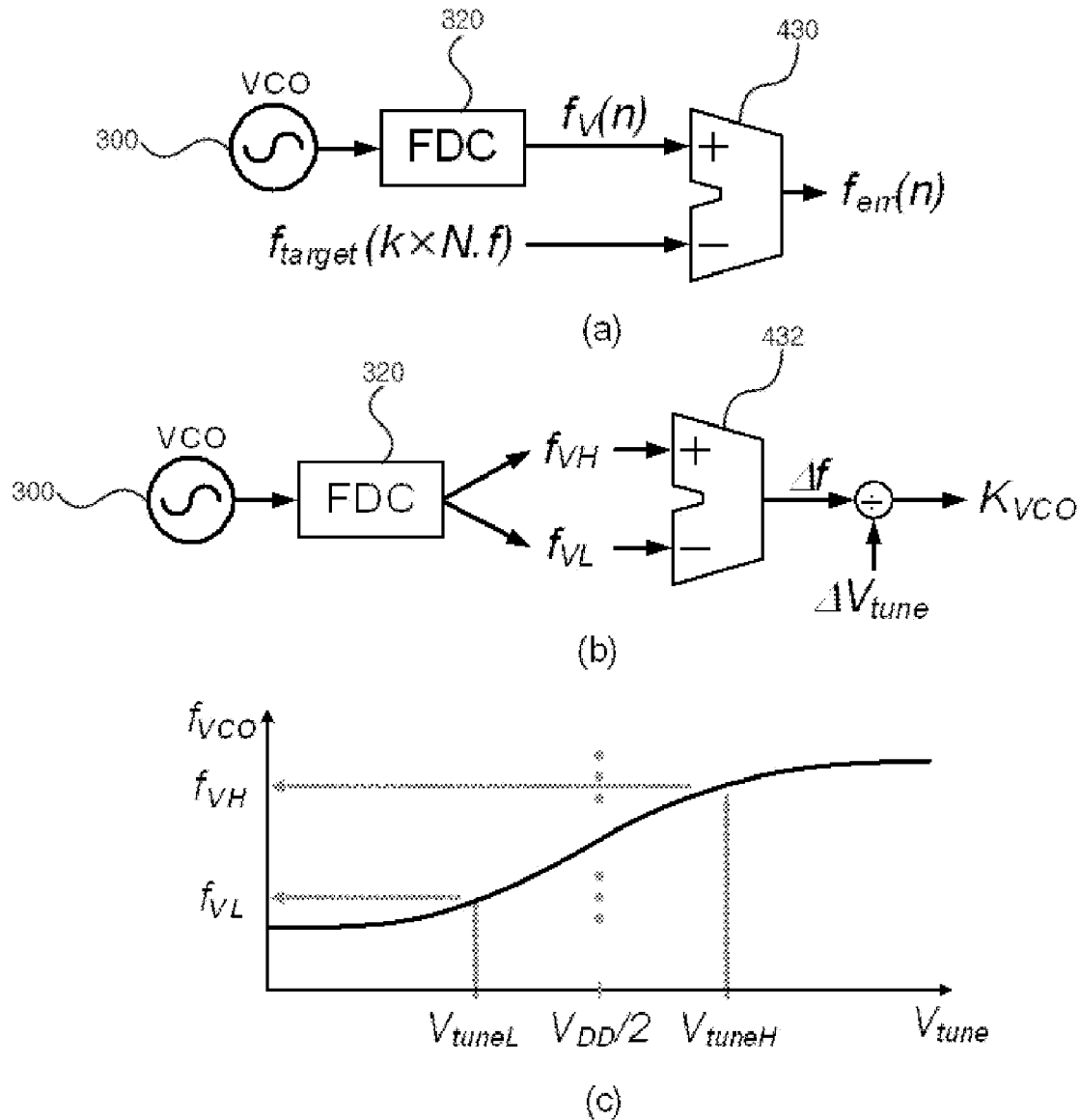
FIG. 6 schematically illustrates the circuitry of a frequency difference detector according to an embodiment of the invention.

FIG. 6 schematically illustrates the circuitry of a frequency difference detector. As illustrated in FIG. 6(a), the frequency difference detector 402 may include a first difference calculator 430 for the automatic frequency calibration. The first difference calculator 430 may calculate the difference $f_{err}(n)$ between the digital value $f_V(n)$ corresponding to the present VCO signal's frequency $f_{VCO}$ and the digital value k×N.f corresponding to the target frequency $f_{target}$, and determine whether the present VCO signal's frequency ($f_{VCO}$) is higher or lower than the target frequency.

Here, $f_{target}$ corresponds to k×N.f, where k is the number of periods of the reference signal ($f_{REF}$) for obtaining a frequency resolution required for calibration, and N.f is a fractional division ratio.

As described above, the first difference calculator 430 may output $f_{err}(n)$, which corresponds to the difference between the frequency of the present VCO signal and the target frequency, and at the same time, the first difference calculator 430 may output a "fast" or "slow" flag signal corresponding to the relative magnitude, i.e. the relative magnitude of the frequency of the present VCO signal with respect to the target frequency, as well as the difference value between $f_V(n)$ and k×N.f.

The automatic frequency calibration logic 404 may search an optimal control code for the capacitor bank 307 according to the flag signal outputted from the frequency difference detector 402.

As the control code for the capacitor bank 307 is changed by the automatic frequency calibration logic 404, the frequency of the VCO signal may be varied, and as a result, the difference value and its relative magnitude may also be varied.

A least difference finder 440 may store the lowest difference value from among the difference values outputted from the first difference calculator 430, and afterwards, may compare the present difference value outputted from the first difference calculator 430 with the lowest difference value stored previously, to store the lower of the two as the new lowest difference value.

Figure 7:
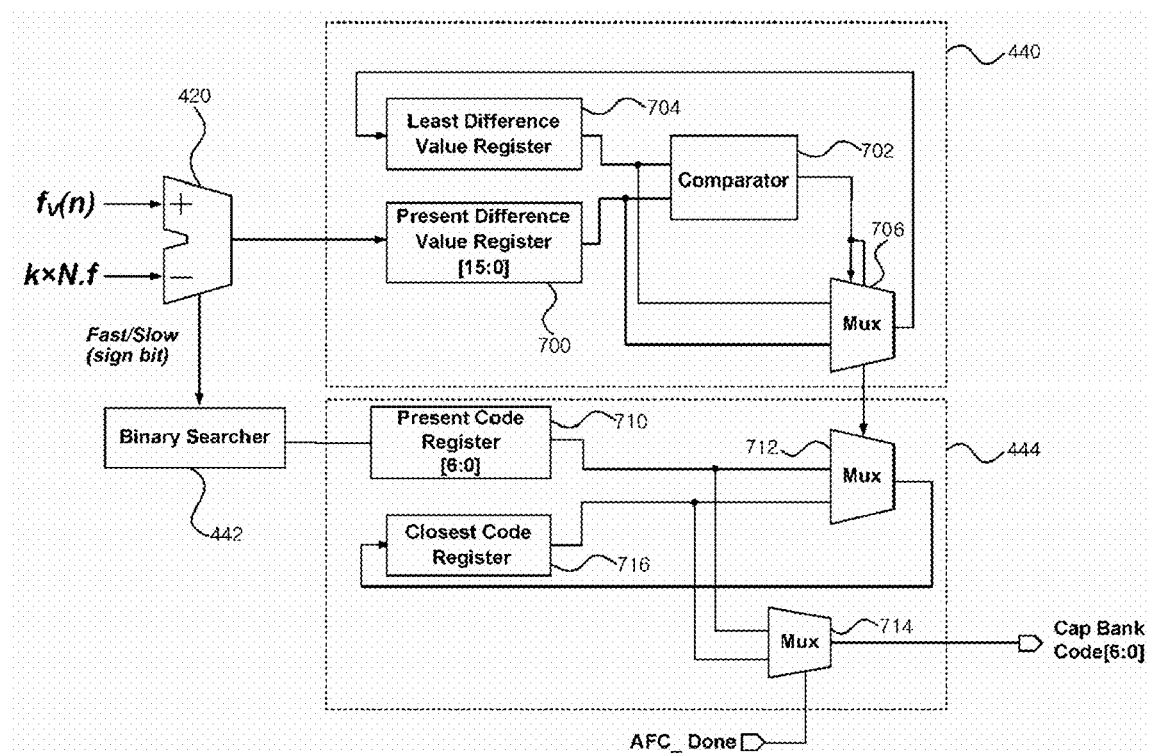
FIG. 7 illustrates the detailed composition of a least difference finder and optimal code selector according to an embodiment of the invention.

As illustrated in FIG. 7, a least difference finder 440 according to this embodiment can include a present difference value register 700, a comparator 702, a least difference value register 704, and a mux (multiplexer) 706.

The present difference value register 700 may store the present difference value outputted from the difference calculator 420.

At an initial stage of automatic frequency calibration, the present difference value outputted from the first difference calculator 430 may be stored in the least difference value register 704.

Afterwards, when the difference calculator 420 outputs a new present difference value, the outputted present difference value may be stored in the present difference value register 700, and the comparator 702 may compare the present difference value with the previous lowest difference value stored in the least difference value register 704.

If the present difference value is lower than the previous lowest difference value, then the lowest difference value may be renewed as the present difference value.

A least difference finder 440 according to this embodiment may repeat the above processes of comparing difference values and renewing the lowest difference value by a particular number of times.

A binary searcher 442 may perform a binary search according to the fast or slow flag signal outputted from the first difference calculator 430.

Unlike a sequential search, a binary search is a method of searching from the most significant bit towards the least significant bit of a code.

A binary searcher 442 according to this embodiment may search a control code for tuning the output frequency of the voltage controlled oscillator 300 closer to the target frequency.

If the voltage controlled oscillator 300 includes a capacitor bank 307 that is switched according to a particular control code, as described above, and the control code for the capacitor bank 307 consists of C bits, then the binary search process may be repeated by C times.

The binary searcher 442 may search the control code for the capacitor bank 307 beginning at a preset initial code, performing the binary search process in such a way to reduce the relative difference between the target frequency and the frequency of the present VCO signal.

During the C number of iterations of the binary search, an optimal code selector 444 according to this embodiment may select as the optimal control code for the capacitor bank 307 a control code corresponding to the lowest difference value decided on by the least difference finder 440, from among the control codes outputted from the binary searcher 442.

As illustrated in FIG. 7, the optimal code selector 444 can include a present code register 710, a first mux 712, a second mux 714, and a closest code register 716.

The present code register 710 may store a present control code searched by the binary searcher 442.

The first mux 712 may output one of the present control code and the closest control code stored in the closest code register 716.

If it is determined by the least difference finder 440 that the present difference value is lower than the previously stored lowest difference value, then the first mux 712 may cooperate with the mux 706 of the least difference finder 440 to output the present control code corresponding to the present difference value, and the outputted present control code may be stored in the closest code register 716.

On the other hand, if it is determined that the present difference value outputted from the first difference calculator 430 is higher than the previously stored lowest difference value, that is, if the previous lowest difference value is to be maintained, then the first mux 712 may output the previously stored closest control code.

The second mux 714 may also selectively output one of the present control code and the closest control code.

According to an embodiment of the invention, since the lowest difference value may be renewed continuously during the binary search, the second mux 714 may output the present control code inputted from the binary searcher 442 when the binary search undergoes its final C-th iteration, and when the final C-th iteration of the binary search is completed, the second mux 714 may output the optimal control code.

Here, the optimal control code is the closest control code stored in the closest code register 716 after the completion of the C number of iterations of the binary search.

According to this embodiment, when the last iteration of the binary search is completed, the timing control logic 400 may output an AFC_Done signal, at which the second mux 714 may output the optimal control code.

For example, if the control code for the capacitor bank 307 is configured in seven bits, the calculation of difference between digital values, comparison, binary search, and all the other steps as described above may be repeated seven times.

According to a preferred embodiment of the invention, the loop bandwidth calibration may be performed after the automatic frequency calibration, such as that described above, is completed.

As illustrated in FIG. 6(b), the frequency difference detector 402 may include a second difference calculator 432, which may calculate the difference between $f_{VH}$ and $f_{VL}$. As shown in FIG. 6(c), $f_{VH}$ and $f_{VL}$ are the frequencies of the outputted signals when $V_{tuneH}$ and $V_{tuneL}$ are transferred to the voltage controlled oscillator 300, where $V_{tuneH}$ and $V_{tuneL}$ are defined as the highest tuning voltage and lowest tuning voltage within a segment for displaying linear frequency tuning characteristics in the optimal control code. Here, an optimal frequency curve refers to a curve representing a frequency outputted during the frequency calibration that is the closest to the target frequency. A loop bandwidth calibration logic 406 according to this embodiment may include a voltage controlled oscillator gain ($K_{VCO}$) calculator 450 and a charge pump code calculator 452.

The voltage controlled oscillator gain calculator 450 may receive $\Delta f$ ($=f_{VH}-f_{VL}$) from the second difference calculator 432, and may calculate $K_{VCO}$ for the optimal control code described above using $\Delta f$ and $\Delta V$ ($=V_{tuneH}-V_{tuneL}$).

The charge pump code calculator 452 may calculate the code for tuning charge pump gain using the calculated $K_{VCO}$ and the target division ratio for the optimal control code.

Here, the new charge pump gain may be calculated by Equation 2 as follows.

$$I_{CP\_target} = I_{CP} \cdot \frac{K_{VCO}}{N.f_{\boxed{????}}} \cdot \frac{N.f_{target}}{\frac{\Delta f}{\Delta V_{tune}}}, \quad [\text{Equation 2}]$$

where $I_{CP\_target}$ is the new charge pump gain, $I_{CP}$ is the charge pump gain at the reference output frequency of the frequency synthesizer, $K_{VCO}$ is the gain of the voltage controlled oscillator at the reference output frequency, $N.f$ is the division ratio at the reference output frequency, $N.f_{target}$ is the division ratio at the target output frequency, and $\Delta f/\Delta V_{tune}$ is voltage controlled oscillator gain at the target output frequency having the above optimal control code.

FIG. 4 illustrates an example in which the chare pump has a 6-bit binary weighted current source, so as to provide a charge output range wide enough to sufficiently compensate for changes in loop bandwidth in a wide band.

When the automatic frequency calibration is performed as above, $K_{VCO}$ and the division ratio ($N.f$) may change, and at this time, it is required to keep the loop bandwidth constant in order for the frequency synthesizer to operate in a stable manner. To this end, the loop bandwidth calibration logic 406 may tune the charge pump gain, after the automatic frequency calibration, to keep the loop bandwidth constant.

Figure 8:
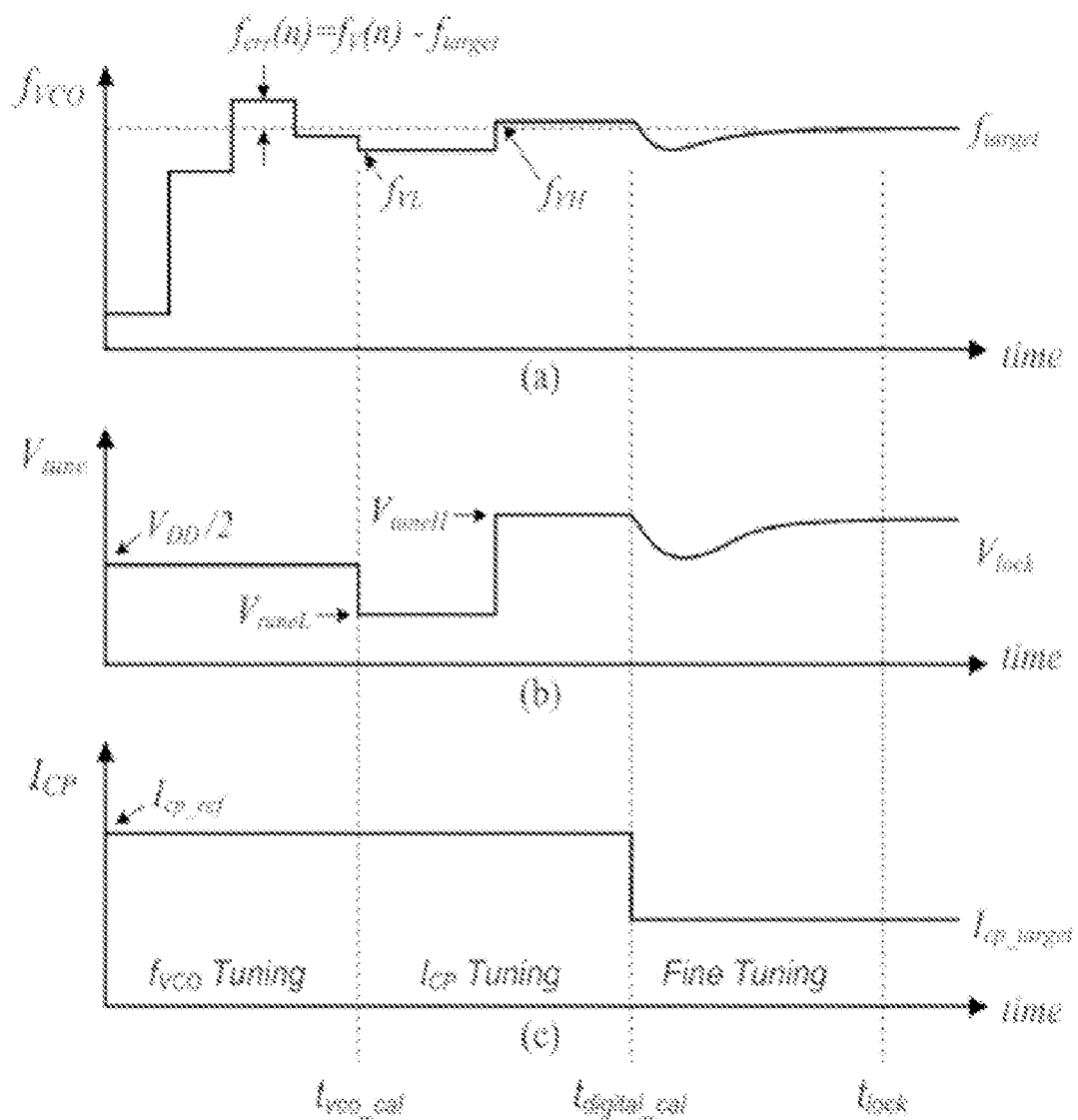
FIG. 8 represents the typical waveforms of the output frequency of a frequency synthesizer, the tuning voltage of a voltage controlled oscillator, and the charge pump gain, with respect to time when an automatic calibration device according to an embodiment of the invention is operated.

FIG. 8 represents changes in output frequency, VCO tuning voltage, and charge pump gain when automatic calibration process is performed according to this embodiment.

For convenience, it is assumed in FIG. 8 that the voltage controlled oscillator 300 includes a 4-bit capacitor bank 307.

FIG. 8(a) represents changes in VCO frequency ($f_{VCO}$) with respect to time during an automatic frequency calibration process, where $f_{VCO}$ is altered by the binary search code. Similar to the graphs in FIG. 8(b) and FIG. 8(c), $V_{tune}$ and $I_{CP}$ are fixed at a half of the supply voltage ($V_{DD}/2$) and $I_{cp\_ref}$.

When the automatic frequency calibration is completed, the capacitor bank 307 code may be set to the optimal control code, and the time required for which is $t_{vco\_cal}$.

After the code for the capacitor bank 307 is set to the optimal control code as described above, loop bandwidth calibration may be started.

For the loop bandwidth calibration, $V_{tune}$ may be changed to $V_{tuneL}$ and $V_{tuneH}$, and the frequency-to-digital converter 320 may extract the frequencies $f_{VL}$ and $f_{VH}$ from the given tuning voltages.

Using the digital value of $K_{VCO}$, the target division ratio $N.f_{target}$, and the reference value for the $K_{VCO}$ divided by $N.f$, the loop bandwidth calibration logic 406 may calculate the charge pump code CP code[5:0] for keeping the loop bandwidth constant at the target frequency.

The total digital calibration time, including automatic frequency calibration and loop bandwidth calibration, is $t_{digital\_cal}$. Finally, the frequency synthesizer including a phase-locked loop may proceed through a closed-loop locking process to lock onto the final target frequency. The total time expended to lock to the target frequency as described above is $t_{lock}$.

According to this embodiment, the calibration time may be minimized, due to the use of a high-speed frequency-to-digital converter 320 that operates at RF frequencies, and a high level of precision may be achieved since the processing of all data may be performed within the digital domain.

When an M-divided VCO output frequency $f_{VCO}/M$ is counted for a calibration time of $k \cdot T_{REF}$, the frequency resolution may be expressed by Equation 3 as follows.

$$f_{resolution} = \frac{M \cdot f_{REF}}{k}, \quad [\text{Equation 3}]$$

where $T_{REF}$ is a period of $f_{REF}$, and k is the number of $T_{REF}$ representing the total time for performing counting.

In conventional automatic frequency calibration, M may usually be set to the phase-locked loop's overall division ratio N.

For example, when $f_{VCO}$=3 GHz, $f_{REF}$=20 MHz, N=150, and M=N, if $f_{resolution}$ of 4 MHz is required, then k must be at least 750, then the calibration time is 37.5 μsec. With an embodiment of the invention, however, the VCO signal may be counted directly using the frequency-to-digital converter 320, so that the value of M may be set to 1, and therefore k can be set to only 5 for obtaining the required resolution, and the frequency calibration time becomes as fast as 250 nsec.

When extracting $f_{VH}$ and $f_{VL}$ for the loop bandwidth calibration, a sufficient $f_{resolution}$ can be obtained by further increasing k. When $f_{REF}$=20 MHz, the value of k for obtaining a $f_{resolution}$ of 400 kHz is k=50. Here, the time taken for extracting a frequency once is very short, being 2.5 μsec. Thus, a frequency-to-digital converter 320 according to an embodiment of the invention can provide the high frequency resolution required for frequency conversion in a very short amount of time.

The operating time ($t_{digital\_cal}$) of the designed automatic calibration device 310, including the control time, is given by $\{(7(k_{vco\_cal}+2)+3)+(2k_{lbw\_cal}+40)\}T_{REF}$, where $k_{vco\_cal}$ is the k value required for acquiring the automatic frequency calibration (VCO calibration) resolution, and $k_{lbw\_cal}$ is the k value required for acquiring the resolution required for calculating $K_{VCO}$ of the optimal control code during loop bandwidth calibration.

When $f_{REF}$=20 MHz, if $f_{resolution}$ for the automatic frequency calibration and the loop bandwidth calibration is 4 MHz and 400 kHz, respectively, then $k_{vco\_cal}$ is 5, and $k_{lbw\_cal}$ is 50. Thus, the total digital calibration time becomes 9.6 μsec.

In comparison to a conventional method, which required 25 μsec for just the loop bandwidth calibration (Y. Akamine et al., "ΔΣ PLL Transmitter with a Loop-Bandwidth Calibration System," IEEE JSSC, February 2008), it can be seen that the automatic frequency calibration and loop bandwidth calibration may be completed effectively within a very short amount of time.

As a protype implementation, a wideband fractional-N frequency synthesizer according to an embodiment of the invention was designed and implemented using a 0.13 μm CMOS process.

The reference frequency ($f_{REF}$) was 19.2 MHz, and the output frequency range of the voltage controlled oscillator 300 was 1880-3980 MHz.

Figure 9:
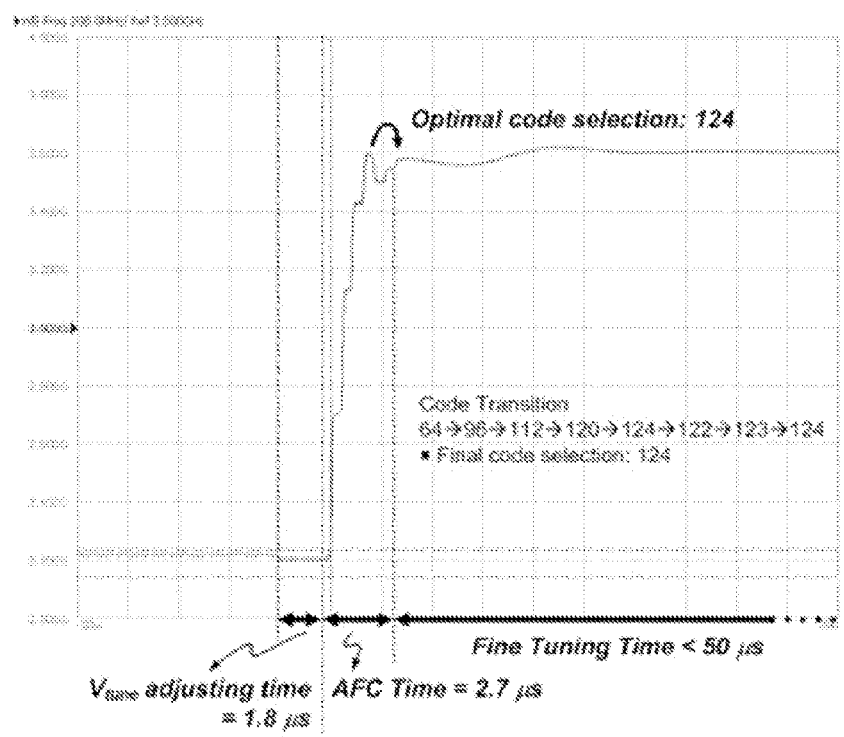
FIG. 9 illustrates an example of measurement results for automatic frequency calibration time.

FIG. 9 represents measurement results for automatic frequency calibration time.

The horizontal axis represents time, and the vertical axis represents VCO output frequency. When the target frequency was set to 3604.77 MHz and k=5, the time for automatic frequency calibration was measured to be 2.7 μs, showing a very fast and superior performance.

When the automatic frequency calibration logic 404 of the automatic calibration device begins to operate, it allows for an adjusting time of 1.8 μs, waiting for $V_{tune}$ to be fixed precisely at $V_{DD} \div 2$, before starting the frequency-to-digital conversion starts. Afterwards, when the binary search is started and code transitions occur 6 times, the binary search is performed 7 times. After the binary search is finished, the final code transition may occur with the selection of the optimal control code. Thus, in the measurement results, 7 code transitions are observed.

Figure 10:
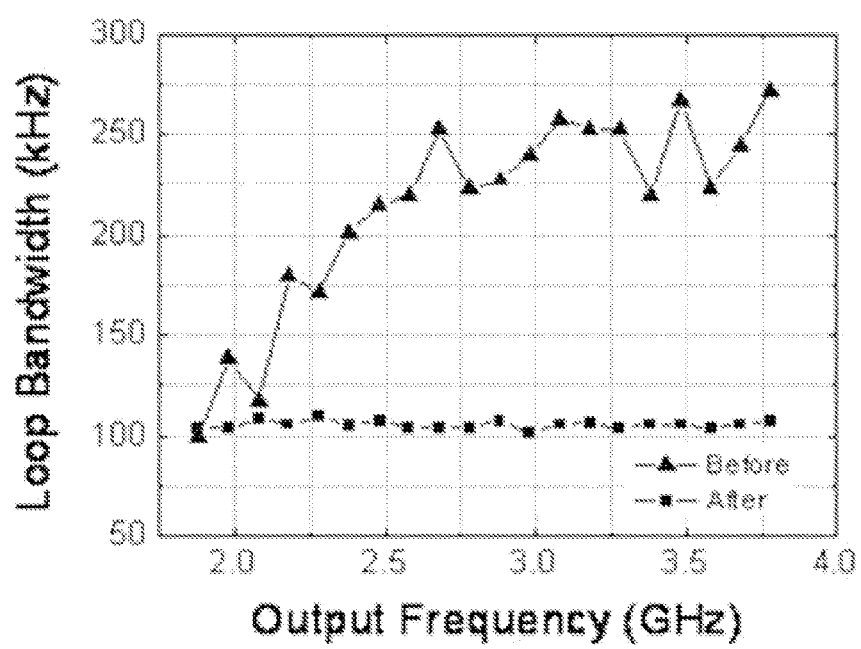
FIG. 10 illustrates an example of measurement results for the loop bandwidths before and after the loop bandwidth calibration process within the entire output frequency band.

FIG. 10 represents loop bandwidths measured before and after loop bandwidth calibration within the entire output frequency band (1880~3980 MHz).

The LBW was distributed over a range of 100-270 kHz before calibration. However, the LBW was distributed over a range of 96-104 kHz after calibration. This means that while the loop bandwidth varied over a wide range of 171% before calibration, it was kept within a much smaller range of ±4% after calibration. Thus, it can be seen that the automatic calibration device 310 based on an embodiment of the invention can perform PLL loop bandwidth calibration in a wideband frequency synthesizer both quickly and accurately.

While the spirit of the invention has been described above in detail with reference to certain embodiments of the invention, it is to be appreciated that those skilled in the art can change or modify the embodiments without departing from the scope and spirit of the invention as defined by the appended claims.

What is claimed is:

1. An automatic calibration device for a phase-locked loop based frequency synthesizer, the automatic calibration device comprising:
a frequency-to-digital converter configured to convert a frequency of a signal outputted from a voltage controlled oscillator into a first digital value;
a frequency difference detector configured to calculate a difference between the first digital value outputted from the frequency-to-digital converter and a second digital value corresponding to a target frequency;
an automatic frequency calibration logic configured to select an optimal control code for a capacitor bank such that an output frequency of the voltage controlled oscillator is closer to the target frequency; and
a loop bandwidth calibration logic configured to tune a charge pump gain such that a loop bandwidth is kept constant at the optimal control code using the frequency-to-digital converter.

2. The automatic calibration device of claim 1, wherein the frequency difference detector comprises:
a first difference calculator configured to calculate the difference between the first digital value and the second digital value; and
a second difference calculator configured to calculate a difference between digital values of frequencies corresponding to a minimum voltage and a maximum voltage within a segment in the optimal control code displaying linear frequency characteristics.

3. The automatic calibration device of claim 2, wherein the loop bandwidth calibration logic comprises:
a voltage controlled oscillator gain calculator configured to calculate a gain of the voltage controlled oscillator using a value outputted from the second difference calculator and the difference between the maximum voltage and minimum voltage; and
a charge pump code calculator configured to calculate a code for tuning charge pump gain using the calculated gain of the voltage controlled oscillator, a reference loop bandwidth, and a division ratio for the optimal control code.

4. The automatic calibration device of claim 3, wherein the charge pump code calculator calculates the charge pump gain for the optimal control code using the following equation:

$$I_{CP_{target}} = I_{CP} \cdot \frac{K_{VCO}}{N.f} \cdot \frac{N.f_{target}}{\frac{\Delta f}{\Delta V_{tune}}}, \quad [\text{Equation}]$$

where $I_{CP\_target}$ is a new charge pump gain, $I_{CP}$ is a charge pump gain at a reference output frequency of the frequency synthesizer, $K_{VCO}$ is a gain of the voltage controlled oscillator at the reference output frequency, N.f is a division ratio at the reference output frequency, $N.f_{target}$ is a division ratio at the target output frequency, and $\Delta f / \Delta V_{tune}$ is a gain of the voltage controlled oscillator at the target output frequency with the optimal control code.

5. The automatic calibration device of claim 1, wherein the frequency-to-digital converter comprises:
a frequency divider configured to divide signals outputted from the voltage controlled oscillator by a particular ratio and output each divided signal as a signal having multiple phases; and
one or more counter configured to count each of the signals having multiple phases.

6. The automatic calibration device of claim 1, further comprising:
a timing control logic configured to generate timing signals for starting and ending the automatic frequency calibration and the loop bandwidth calibration.

7. The automatic calibration device of claim 1, wherein the automatic frequency calibration logic comprises:
a binary searcher configured to perform a binary search according to a relative difference between the first digital value and the second digital value; and
an optimal code selector configured to select an optimal control code through a difference value calculated by the frequency difference detector and a search result of the binary searcher, the optimal code being such that causes the voltage controlled oscillator to output a frequency close to the target frequency.

8. The automatic calibration device of claim 7, wherein the frequency difference detector outputs one of a fast or a slow flag signal corresponding to a relative difference between the first digital value and the second digital value, and the binary searcher performs the binary search according to the fast signal or slow signal.

9. The automatic calibration device of claim 7, wherein the first digital value varies according to a control code selected by the optimal code selector before completion of frequency calibration, and the frequency difference detector periodically outputs a difference value between the varying first digital value and the second digital value.

10. The automatic calibration device of claim 9, wherein the automatic frequency calibration logic further comprises:

a least difference finder configured to renew a least difference value by comparing a difference value presently outputted by the frequency difference detector with a previously stored least difference value.

11. The automatic calibration device of claim 10, wherein the optimal code selector stores as a closest code a control code searched by the binary searcher at a point when the least difference value is renewed.

12. An automatic calibration device for a phase-locked loop based frequency synthesizer, the automatic calibration device comprising:

a frequency-to-digital converter configured to convert frequencies of a first signal and a second signal outputted from a voltage controlled oscillator into a first digital value and a second digital value, respectively;

a frequency difference detector configured to calculate a difference between the first digital value and the second digital value; and a loop bandwidth calibration logic configured to tune a charge pump gain using a difference between the first digital value and the second digital value such that a loop bandwidth is kept constant within a range of output frequency bands of the voltage controlled oscillator, wherein the first signal is a signal outputted by the voltage controlled oscillator for a minimum voltage within a segment displaying linear frequency characteristics in an optimal control code for a capacitor bank of the voltage controlled oscillator, and the second signal is a signal outputted by the voltage controlled oscillator for a maximum voltage within the segment.

13. The automatic calibration device of claim 12, wherein the loop bandwidth calibration logic comprises:

a voltage controlled oscillator gain calculator configured to calculate a gain of the voltage controlled oscillator using the difference value between the first digital value and the second digital value outputted from the frequency difference detector; and a charge pump code calculator configured to calculate a code for tuning charge pump gain using the calculated gain of the voltage controlled oscillator, a reference loop bandwidth, and a division ratio for the optimal control code.

14. The automatic calibration device of claim 12, wherein the frequency difference detector calculates a difference between a third digital value outputted by the frequency-to-digital converter before loop bandwidth calibration and a fourth digital value corresponding to a target frequency, and the automatic calibration device further comprises an automatic frequency calibration logic configured to select an optimal control code for the capacitor bank such that the third digital value before the loop bandwidth calibration is closer to the fourth digital value.

15. The automatic calibration device of claim 14, further comprising:

a binary searcher configured to perform a binary search according to a relative difference between the third digital value and the fourth digital value; and an optimal code selector configured to select an optimal control code through a difference value calculated by the frequency difference detector and a search result of the binary searcher, the optimal code being such that causes the voltage controlled oscillator to output a frequency close to the target frequency.

16. An RF frequency synthesizer comprising:

a phase-locked loop, the phase-locked loop comprising a voltage controlled oscillator, a frequency divider, a reference frequency generator, a phase/frequency detector, and a pulse-voltage converter; and an automatic calibration loop, the automatic calibration loop comprising the voltage controlled oscillator and an automatic calibration device, wherein the automatic calibration device comprises: a frequency-to-digital converter configured to convert a frequency of a signal outputted from a voltage controlled oscillator into a first digital value, a frequency difference detector configured to calculate a difference between the first digital value outputted from the frequency-to-digital converter and a second digital value corresponding to a target frequency, an automatic frequency calibration logic configured to select an optimal control code for a capacitor bank such that an output frequency of the voltage controlled oscillator is closer to the target frequency, and a loop bandwidth calibration logic configured to tune a charge pump gain such that a loop bandwidth is kept constant at the optimal control code using the frequency-to-digital converter.

* * * * *